United States Patent
Yanagisawa

(10) Patent No.: US 7,038,254 B2
(45) Date of Patent: May 2, 2006

(54) HETERO-JUNCTION BIPOLAR TRANSISTOR HAVING A TRANSITION LAYER BETWEEN THE BASE AND THE COLLECTOR

(75) Inventor: Masaki Yanagisawa, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/738,114

(22) Filed: Dec. 18, 2003

(65) Prior Publication Data

US 2004/0169196 A1    Sep. 2, 2004

(30) Foreign Application Priority Data

Dec. 19, 2002    (JP)    ............... 2002-367459

(51) Int. Cl.
*H01L 31/0328* (2006.01)
(52) U.S. Cl. .................. 257/197; 257/198; 257/191
(58) Field of Classification Search ........ 257/197–198, 257/12, 565
See application file for complete search history.

(56) References Cited

U.S. PATENT DOCUMENTS

| | | | | |
|---|---|---|---|---|
| 5,150,185 | A * | 9/1992 | Yamada | 257/197 |
| 5,557,117 | A * | 9/1996 | Matsuoka et al. | 257/184 |
| 5,656,515 | A * | 8/1997 | Chandrasekhar et al. | 438/319 |
| 5,684,310 | A * | 11/1997 | Liu | 257/197 |
| 5,844,253 | A * | 12/1998 | Kim et al. | 257/24 |
| 6,459,103 | B1 * | 10/2002 | Liu et al. | 257/197 |
| 6,563,145 | B1 * | 5/2003 | Chang et al. | 257/197 |
| 6,809,400 | B1 * | 10/2004 | Harmon et al. | 257/567 |
| 6,847,060 | B1 * | 1/2005 | Welser et al. | 257/197 |
| 6,855,613 | B1 * | 2/2005 | Hamm et al. | 438/312 |
| 2003/0136956 | A1 * | 7/2003 | Niwa et al. | 257/12 |
| 2003/0234400 | A1 * | 12/2003 | Udagawa | 257/80 |
| 2004/0046176 | A1 * | 3/2004 | Kim et al. | 257/83 |
| 2004/0214401 | A1 * | 10/2004 | Krueger et al. | 438/317 |

FOREIGN PATENT DOCUMENTS

| | | | |
|---|---|---|---|
| JP | 404127534 | * | 4/1992 |
| JP | 4-221834 | * | 8/1992 |
| JP | 05-036759 | | 3/1993 |

OTHER PUBLICATIONS

Kenji Kurishima et al., "Fabrication and Characterization of High-Performance InP/InGaAs Double-Heterojunction Bipolar Transistors," IEEE Transactions on Electron Devices, vol. 41 No. 8 (1994) pp. 1319-1326.

(Continued)

*Primary Examiner*—Nathan J. Flynn
*Assistant Examiner*—Ahmed N. Sefer
(74) *Attorney, Agent, or Firm*—Smith, Gambrell & Russell, LLP

(57) ABSTRACT

This invention provides a double hetero-junction bipolar transistor (DHBT) in which a probability of the impact ionization at the interface between the base and the collector is reduced, thereby enhancing the break down voltage. In the present DHBT, a plurality of transition layers is inserted between the base layer and the collector layer. Each transition layers has an energy band gap gradually increasing from the base to the collector, and comprises a doped layer close to the base and an un-doped layer. Transition layers thus configured may bring both characteristics of the high break down voltage by the reduction of the average doping concentration and the capability of the high-speed operation by the reduction of the junction capacitance.

11 Claims, 4 Drawing Sheets

OTHER PUBLICATIONS

David Caffin, et al., "Base-Collector Leakage Currents in InP/InGaAs Double Heterojunction Bipolar Transistors", IEEE Transactions on Electron Devices, vol. 44, No. 6 (1997) pp. 930-936.

K. Yang, et al., "Double Heterojunction Bipolar Transistors with Chirped InGaAs/InP Superlattice Base-Collector Junction Grown by CBE", Proc. Of the 1997 Int. Conf. On Indium Phosphide and Related Materials (IPRN 1997) held at Hyannis (USA) (1997) ThE5, pp. 645-648.

Bo Willén, et al., "High-Gain, High-Speed InP/InGaAs Double-Heterojunction Bipolar Transistors with a Step-Graded Base-Collector Heterojunction", IEEE Electron Device Letters, vol. 16, No. 11 (1995) pp. 479-481.

Michio Ohkubo, et al., "InGaAs/InP double-heterojunction bipolar transistors with step graded InGaAsP between InGaAs base and InP collector grown by metalorganic chemical vapor deposition" Applied Physics Letters 59 (21), (1991), pp. 2697-2699.

Chanh Nguyen, et al., "AlInAs/GaInAs/InP Double Heterojunction Bipolar Transistors with a Novel Base-Collector Design for Power Applications", IEEE Electron Device Letters, vol. 17, No. 3 (1996), pp. 133-135.

* cited by examiner

HETERO-JUNCTION BIPOLAR TRANSISTOR HAVING A TRANSITION LAYER BETWEEN THE BASE AND THE COLLECTOR

BACKGROUND OF THE INVENTION

1. Field of the Invention

The present invention relates to a hetero-junction bipolar transistor, especially a double hetero-junction bipolar transistor.

2. Description of the Prior Art

The hetero-junction bipolar transistor (hereinafter denoted by HBT) is going to be commercially realized in devices made of group III-V compound semiconductors and silicon-germanium due to its ability to operate at high speed compared to homo-junction transistors. In the HBT, the minority carrier injection from the base layer to the emitter layer is reduced by the wider band gap energy of the emitter layer than that of the base layer, thereby increasing the current multiplication factor.

When the collector layer has a band gap energy comparable to that of the base layer, the breakdown voltage between the collector layer and the base layer decreases because the electron-hole pair generated by the impact ionization at the collector layer increases. One solution to the degradation of the breakdown voltage is proposed to widen the band gap energy of the collector layer compared to the base layer, which is called as the double hetero-junction bipolar transistor (hereinafter denoted by DHBT). In the DHBT, the collector layer is made of semiconductor material, whose band gap energy is greater than that of the base layer, which suppresses the abrupt increase of the electron-hole pair by the impact ionization at the collector layer and the degradation of the breakdown voltage.

However, a large band gap difference between the collector layer and the base layer in the DHBT leads a spike in the conduction band. This spike functions as a large barrier for conduction electrons, which degrades the operational speed of the transistor and the ability to operate at lower bias condition. Japanese Patent laid open 05-036759 discloses to insert additional layer between the base layer and the collector layer such that the spike in the conduction band disappears. This additional layer has a multi-quantum well structure in which the conduction band continuously varies from the base layer to the collector layer so as not to form the spike. Since the conduction electron can pass the barrier layer of the multi-quantum well by the tunneling, the barrier layer does not regard as an obstacle for the conduction electron.

Another prior art, Applied Physics Letters vol. 59(21), pp. 2697 (1991), discloses the intermediate layer between the base layer and the collector layer as a graded layer, whose band gap energy varies in stepwise configuration.

However, the tunneling probability expected in the former prior art depends on the thickness of the barrier and the depth in the energy band diagram of the well layer. To pass the conduction electron therethrough is to thin the width of the barrier layer. On the other hand, the energy band diagram of the multi-quantum well structure is determined by the width and the depth of the well layer thereof. When the energy band diagram necessary for the intermediate layer between the base layer and the collector layer is to be realized by the quantum well structure, a consistent condition would be hard to obtain. In particular, when the depth of the well layer is first determined by the condition required for the intermediate layer, the number of the well layer must be huge.

When the graded layer is provided between the base layer and collector layer as in the latter prior art and the graded layer is doped, the region between the base layer and the collector layer is not depleted and residual carriers are accumulated therein. This residual carrier brings the increase of the junction capacitance, thereby degrading the high-frequency performance of the transistor.

SUMMARY OF THE INVENTION

One aspect of the present invention, a double hetero junction bipolar transistor (DHBT) comprises a collector layer, a base layer and an emitter layer. Band gap energy of the base layer is smaller than that of the collector layer and the emitter layer. The DHBT further comprises a plurality of transition layers provided between the base layer and the collector layer. The band gap energy of respective transition layers gradually increases from the base layer to the collector layer, and are greater than that of the base layer and smaller than that of the collector layer. The respective transition layers have a doped layer close to the base layer and an un-doped layer close to the collector layer.

Since the DHBT of the present invention has the plurality of transition layers and each having band gap energy gradually increasing from the base layer to the collector layer, the band discontinuity may be loosened, whereby the electron may move rapidly in the conduction band. Further, since each transition layer is divided into two layers, one of which is doped layer and the other is un-doped layer, the average doping concentration may lower. This moderates the slope of the conduction band and decreases the scattering probability of the conduction electron, thereby enhancing the high-frequency performance of the DHBT.

The emitter layer and the collector layer may be InP, the base layer may be $In_xGa_{1-x}As$ lattice-matched to InP, and the transitions layers may be $In_yGa_zAl_{1-y-z}As$. The transition layer closest to the base layer has the smallest aluminum composition and the transition layer closest to the collector layer has the largest aluminum composition, whereby the energy band gap of respective transition layers monotonically varies from the base layer to the collector layer.

The DHBT of the present invention may further comprise an emitter contact layer and a sub-collector layer each made of $In_xGa_{1-x}As$ lattice matched to InP. The emitter contact layer is in contact with the emitter layer at the opposing side of the base layer, and the sub-collector layer is in contact with the collector layer at the opposing side of the transition layer. The emitter contact layer and the sub-collector layer lowers the contact resistance of the anode electrode and the cathode electrode, respectively.

The DHBT may comprise an un-doped intermediate layer between the transition layer and the base layer. This intermediate layer may loosen the band discontinuity between the base layer and the transition layer.

DETAILED DESCRIPTION OF PREFERRED EMBODIMENTS

A structure of a bipolar transistor according to the present invention and a function originated to the structure will be described hereinbelow.

Figure 1:
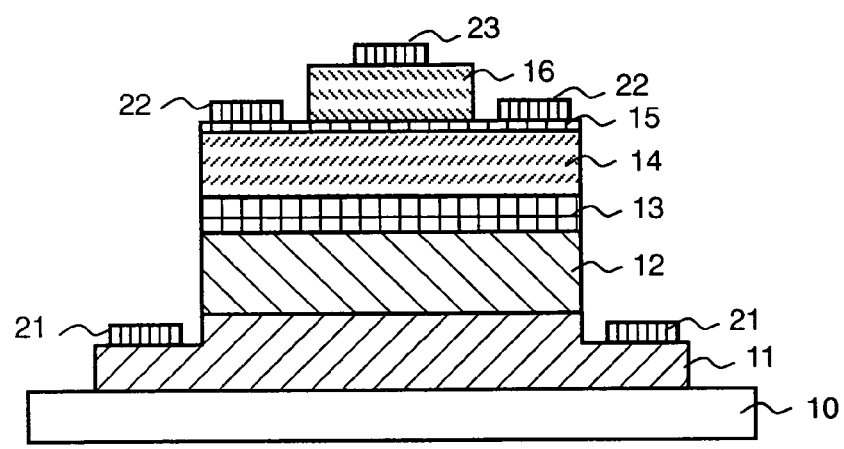
FIG. 1 is a cross sectional view of the hetero-junction bipolar transistor of the present invention.

FIG. 1 shows a cross sectional view of a double heterojunction bipolar transistor of the present invention. The transistor comprises a semi-insulating InP substrate 10, and (i) an $In_xGa_{1-x}As$ layer with a thickness of 300 nm provided on the InP substrate and a InP layer doped with Si by $2\times10^{19}$ $cm^{-3}$ with a thickness of 20 nm as a sub-collector layer 11. On the sub-collector layer 11, (ii) a first InP layer doped with Si by $1\times10^{16}$ $cm^{-3}$ with a thickness of 350 nm and another InP layer doped with Si by $2\times10^{17}$ $cm^{-3}$ with a thickness of 5 nm are provided. These two layers of InP function as a collector layer 12.

On the collector layer 12, (iii) a transition layer 13 made of a plurality $In_xGa_yAl_{1-x-y}As$ is provided with a total thickness of 60 nm. Doping concentrations and thickness of respective $In_xGa_yAl_{1-x-y}As$ layers will be described later. On the transition layer 13, (iv) an $In_xGa_{1-x}As$ layer doped with carbon (C) by $4\times10^{19}$ $cm^{-3}$ with a thickness of 50 nm are provided, which functions as a base layer 14.

On the base layer 14, (v) an InP layer doped with Si by $4\times10^{18}$ $cm^{-3}$ with a thickness of 10 nm as an emitter layer 15, and (vi) an un-doped $In_xGa_{1-x}As$ layer with a thickness of 50 nm and another $In_xGa_{1-x}As$ layer doped with Si by $2\times10^{19}$ $cm^{-3}$ with a thickness of 200 nm are stacked. Two $In_xGa_{1-x}As$ layers on the emitter layer 15 operate as an emitter contact layer 16.

Next, the transition layer 13 of the present embodiment will be described in detail. The transition layer 13 involves seven $In_xGa_yAl_{1-x-y}As$ layers, namely from the InP collector layer: 1) an un-doped $In_xGa_yAl_{1-x-y}As$ (x=0.53, y=0.26) with a thickness of 15 nm; 2) an $In_xGa_yAl_{1-x-y}As$ (x=0.53, y=0.26) doped with Si by $5\times10^{17}$ $cm^{-3}$ with a thickness of 5 nm; 3) an un-doped $In_xGa_yAl_{1-x-y}As$ (x=0.53, y=0.35) with a thickness of 5 nm; 4) an $In_xGa_yAl_{1-x-y}As$ (x=0.53, y=0.35) doped with Si by $5\times10^{17}$ $cm^{-3}$ with a thickness of 5 nm; 5) an un-doped $In_xGa_yAl_{1-x-y}As$ (x=0.53, y=0.42) with a thickness of 15 nm; 6) an $In_xGa_yAl_{1-x-y}As$ (x=0.53, y=0.42) doped with Si by $5\times10^{17}$ $cm^{-3}$ with a thickness of 5 nm; and (7) an un-doped $In_xGa_{1-x}As$ layer with a thickness of 20 nm.

The transition layer includes three pair of $In_xGa_yAl_{1-x-y}As$ layers and one $In_xGa_{1-x}As$ layer. Each pair of $In_xGa_yAl_{1-x-y}As$ layer contains an un-doped $In_xGa_yAl_{1-x-y}As$ layer with a thickness of 15 nm and a Si-doped $In_xGa_yAl_{1-x-y}As$ layer with a thickness of 5 nm, and Ga compositions of each pair of $In_xGa_yAl_{1-x-y}As$ layers increase from 0.26 to 0.42 from the collector layer 12.

The table below summarizes the configuration of layers from (i) to (vi).

|  | Layer | Material | Thickness (nm) | Doping (cm$^{-3}$) |
|---|---|---|---|---|
| (vi) | emitter contact layer | $In_xGa_{1-x}As$ | 200 | Si $2\times10^{19}$ |
| (v) | emitter layer | InP | 10 | Si $2\times10^{18}$ |
| (iv) | base layer | $In_xGa_{1-x}As$ | 50 | C $4\times10^{19}$ |
| (iii) | transition layers | $In_xGa_{1-x}As$ | 20 | Un-dope |
|  |  | $In_xGa_yAl_{1-x-y}As$ [x: 0.52, y: 0.40] | 15 | Un-dope |
|  |  | $In_xGa_yAl_{1-x-y}As$ [x: 0.52, y: 0.40] | 5 | Si $5\times10^{17}$ |
|  |  | $In_xGa_yAl_{1-x-y}As$ [x: 0.52, y: 0.34] | 15 | Un-dope |
|  |  | $In_xGa_yAl_{1-x-y}As$ [x: 0.52, y: 0.34] | 5 | Si $5\times10^{17}$ |
|  |  | $In_xGa_yAl_{1-x-y}As$ [x: 0.52, y: 0.28] | 15 | Un-dope |
|  |  | $In_xGa_yAl_{1-x-y}As$ [x: 0.52, y: 0.28] | 5 | Si $5\times10^{17}$ |
| (ii) | collector layer | InP | 5 | Si $2\times10^{17}$ |
|  |  | InP | 325 | Si $1\times10^{16}$ |
| (i) | sub-collector layer | InP | 20 | Si $2\times10^{19}$ |
|  |  | $In_xGa_{1-x}As$ | 300 | Si $2\times10^{19}$ |

The composition of $In_xGa_{1-x}As$ is x=0.53 and those of the $In_xGa_yAl_{1-x-y}As$ of the transition layers are shown in the table. These compositions are defined by the condition whose lattice constant matches to the lattice constant of InP. The un-doped $In_xGa_{1-x}As$ layer with the thickness of 20 nm inserted between the transition layer 13 and the base layer 14 is decreases the potential of the conduction band of the $In_xGa_yAl_{1-x-y}As$ layer nearest to the base layer, whereby the potential barrier affecting conduction electrons entering from the base layer to the transition layer may be decreased. Similarly, the reason why the collector layer involves two layer each having difference doping amount is to suppress the blocking effect for the conducting electrons due to the discontinuity of the conduction band formed between the transition layer and the collector layer.

After the growth of all layers, the DHBT is thus manufactured. First, the emitter contact layer is formed to a predetermined mesa structure. Next, the emitter layer, the base layer and the collector layer are so processed to form a primary mesa as to leave the emitter contact mesa within the primary mesa. Finally, the sub-collector layer between the DHBT to be formed is removed to the semi-insulating InP substrate, thereby securing the electrical isolation between DHBTs.

In the process to form the emitter contact mesa and the primary mesa, an etchant containing phosphoric acid is used for the etching of $In_xGa_{1-x}As$, while another etchant containing hydrochloric acid is used for InP. These etchants show a selective etching characteristic. Namely, the former etchant containing phosphoric acid can etch $In_xGa_{1-x}As$ but hardly etches InP. On the other hand, the latter etchant containing hydrochloric acid can etch InP but $In_xGa_{1-x}As$. Therefore, an InP layer may be used as an etch-stopping layer for the etchant containing phosphoric acid, and an $In_xGa_{1-x}As$ layer can be used as the etch-stopping layer for the etchant containing hydrochloric acid. After forming of the emitter contact mesa and the primary mesa, and removing the excess sub-collector layer, the electrodes are formed on the emitter contact layer, the base layer and the sub-collector layer. Then, the DHBT thus processed is completed as shown in FIG. 1.

Figure 2:
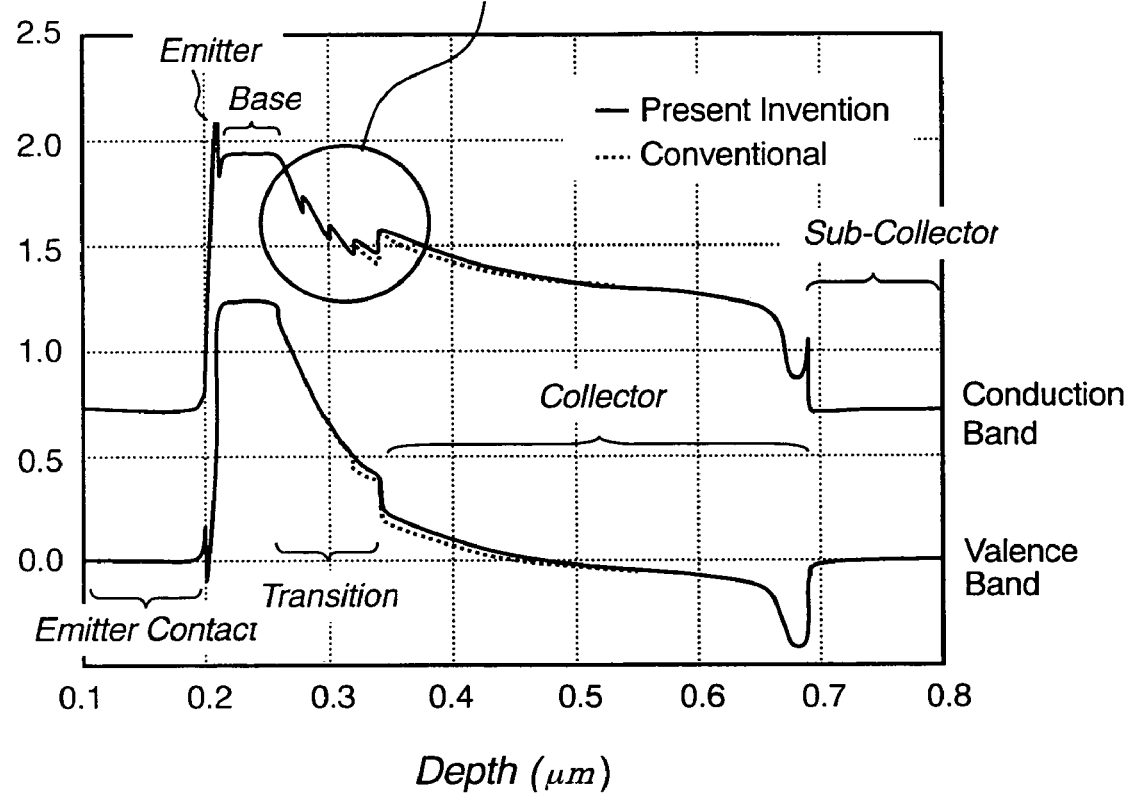
FIG. 2 is an energy band diagram referenced by the top surface of the emitter contact layer.
Figure 3:
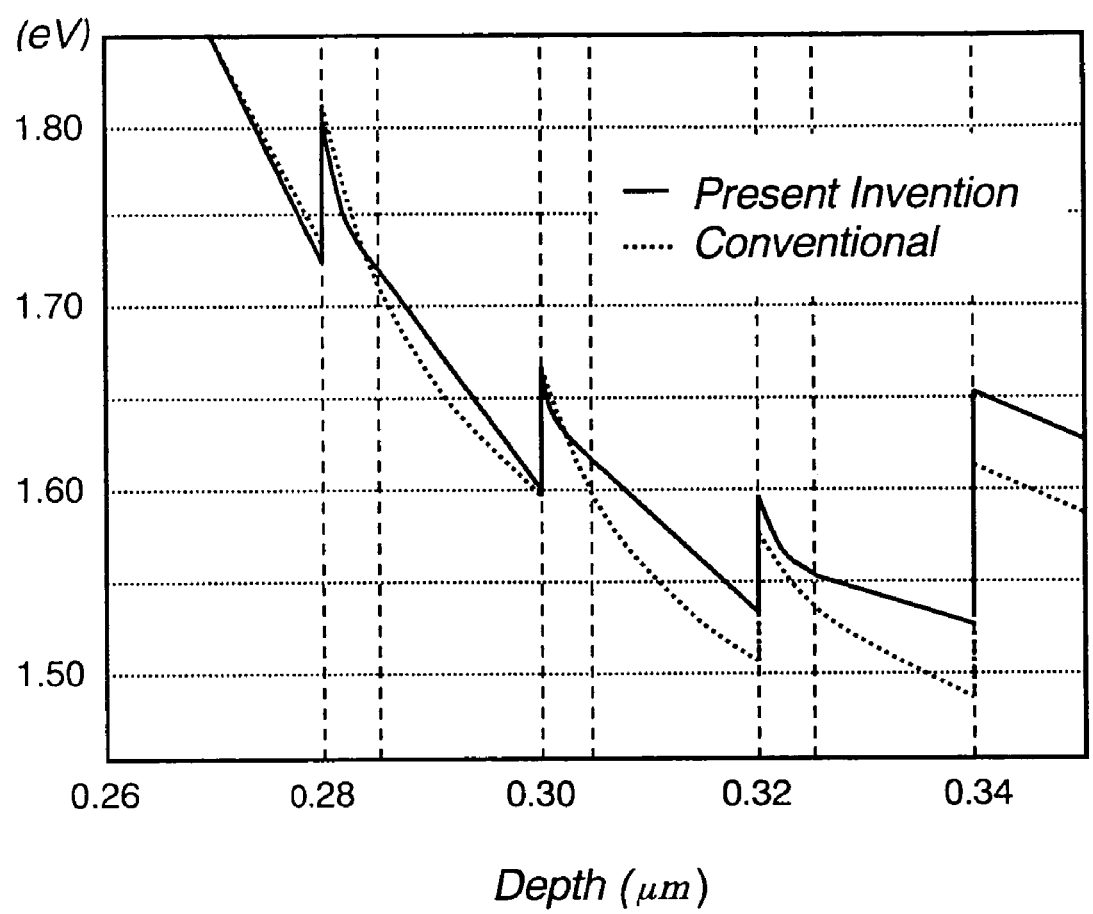
FIG. 3 magnifies the portion of the intermediate layer shown in FIG. 2.

FIG. 2 shows a band diagram of the DHBT shown in FIG. 1 and FIG. 3 compares the structure of the conduction band to that of the conventional transistor. In FIG 2, the horizontal axis denotes a depth from the surface of the emitter contact layer 16, and the vertical axis denotes the band diagram of the conduction band under no bias condition. In the conventional device, the transition layer is uniformly doped with Si and the band diagram thereof is as shown by a dotted line. The solid line in FIG. 3 shows the band diagram of the present invention. Uniformly doping implies that six layers in the transition layer in table 1 has a same doping concentration of $1.25 \times 10^{17}$ cm$^{-3}$ and a thickness of layers having the same Ga composition is 20 nm, which is equal to a sum of the doped layer with the thickness of 5 nm and the un-doped layer with the thickness of 15 nm of the present invention.

The transition layer 13 comprises a plurality of layers each having different compositions gradually varying from the base layer to the collector layer. Namely, the layer nearest to the base layer has the composition by which the band gap energy is closest to that of the base layer and the layer nearest to the collector layer has the band gap energy closest to that of the collector layer. This band gap discontinuity becomes a barrier for electrons travelling from the base layer to the contact layer. Therefore, the discontinuity is preferable to be as small as possible. Even in the present configuration of the transition layer, the band discontinuity may occur. However in the present invention, only a portion of the layer, a quarter in thickness from the side of the base layer, is doped. Since the band discontinuity of the conduction band may occur only in a quarter of respective layers having the same composition, the thickness of the barrier due to the band discontinuity can be thinner than that of the conventional device, thereby increasing the tunneling probability of electrons traveling from the base layer to the collector layer.

Moreover, in, respective transition layers, only the portion close to the base layer is doped and the rest portion is un-doped. The average doping concentration of the transition layer is smaller than that of the conventional device having the uniform doping profile. Therefore, the slope of the conduction band becomes gradual, whereby the probability of the inter-valley scattering becomes small for electrons travelling in the transition layer and being accelerated by this conduction band slope. When electrons are scattered from the Γ valley to the L valley, the effective mass of the electron becomes heavy and the mobility of the electron becomes small, thereby degrading the high-frequency performance of the DHBT. In the present invention, the slope of the conduction band is gradual compared to the conventional device, in the transition layer 13 and the layer between the transition layer 13 and the base layer 14, which reduces the probability of the inter-valley scattering of the electron.

In addition to the decrease of the inter-valley scattering, the probability of the impact ionization is also reduced. The impact ionization is that the travelling electron accelerated by the slope of the conduction band collides with an impurity and ionizes the collided impurity, thereby generating another electrons and reducing the break down voltage between the base layer and the collector layer. In the present invention, since the slope of the conduction band from the base layer to the collector layer becomes gradual, the probability of the impact ionization becomes small and the break down voltage between the base layer and the collector layer can increase.

Figure 4:
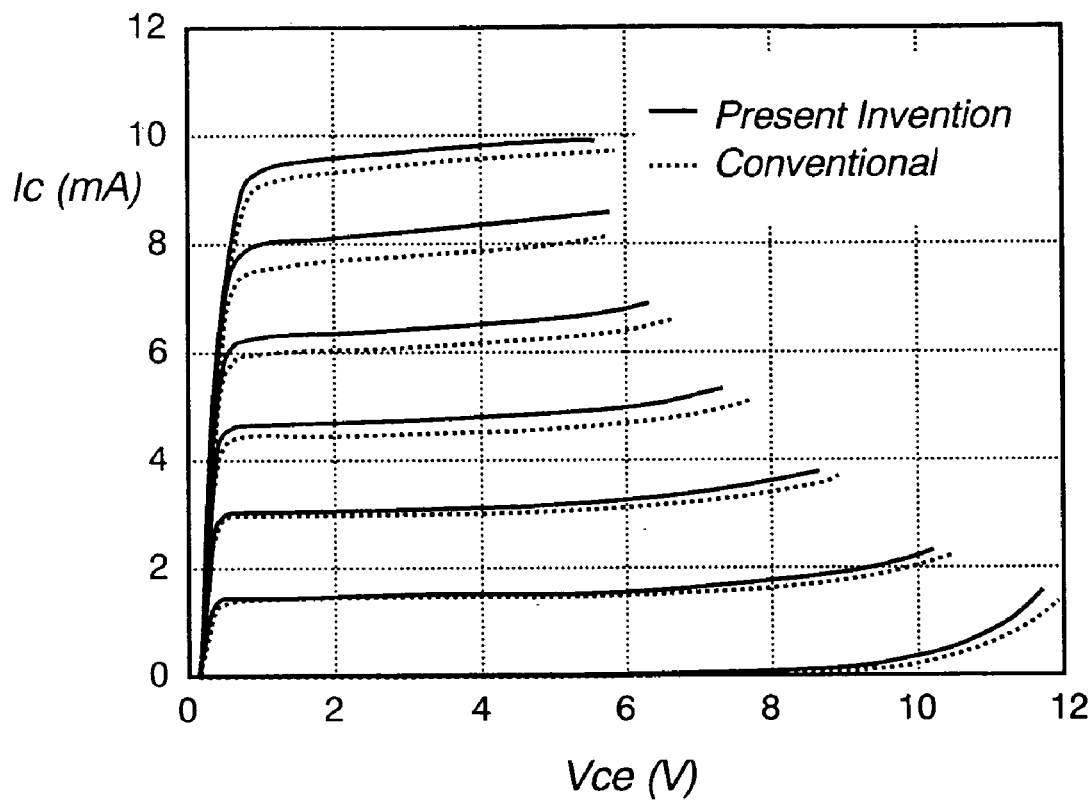
FIG. 4 compares the static characteristic of the present transistor to a conventional one.

FIG. 4 compares the static characteristic of the present DHBT and the conventional device. It is clearly understood that the present DHBT shows a greater current multiplication factor β, especially in the region where the small collector voltage and the large base current. This result reflects the band diagram of the present invention, namely not only the small band discontinuity but also the width of the barrier due to the band discontinuity becomes small, which enhances the electron to travel the conduction band easily and to tunnel the barrier.

In the present HBT, a plurality of the transition layers is provided between the base layer and the collector layer, and the band gap energy of these transition layers gradually increase from the base layer to the collector layer. Therefore, the band discontinuity, which appears in the conventional device, can be loosened and the electron can move rapidly in the conduction band because the barrier that scatters the conduction electron is lowered.

Further, the plurality of the transition layers is divided into two layers, one is doped and the other is un-doped. The average doping concentration of the transition layers becomes smaller than that in the case of the uniform doping, which moderates the slope of the conduction band and decreases the scattering probability of the conduction electron. Accordingly, the high-speed operation can be realized as compared with the conventional DHBT that has a large inter-valley scattering probability.

Moreover, the doped layer in the transition layer has a doping concentration greater than that in the case of the uniform doping, which decreases the width of the barrier formed at the interface to the neighbor layer. Therefore, the tunneling probability of the conduction electron increases and enhances the high-speed operation of the transistor.

What is claimed is:

1. A double hetero-junction transistor including a collector layer, a base layer and an emitter layer, a band gap energy of the base layer is smaller than a band gap energy of the collector layer and a band gap energy of the emitter layer, the double hetero-junction transistor comprising:

a plurality of transition layers provided between the base layer and the collector layer, band gap energies of respective of the transition layers gradually increasing from the base layer to the collector layer and being greater than the band gap energy of the base layer and smaller than the band gap energy of the collector layer, wherein respective transition layers have a doped layer close to the base layer and an un-doped layer close to the collector layer, the doped layer being doped to have a same conduction type as the collector layer.

2. The double hetero-junction bipolar transistor according to claim 1, wherein the number of transition layers is greater than or equal to 2 and smaller than or equal to 4.

3. The double hetero-junction bipolar transistor according to claim 1, wherein the emitter layer and collector layer are InP, the base layer is $In_xGa_{1-x}As$ lattice-matched to InP and respective transition layers are $In_yGa_zAl_{1-y-z}As$ each having a particular aluminum composition, and wherein the transition layer closest to the base layer has a smallest aluminum composition and the transition layer closest to the collector layer has a largest aluminum composition.

4. The double hetero-junction bipolar transistor according to claim 3, further comprising an emitter contact layer made of $In_xGa_{1-x}As$ lattice matched to InP, the emitter contact layer being in contact with the emitter layer at the opposing side of the base layer, and a sub-collector layer made of $In_xGa_{1-x}As$ lattice matched to InP, the sub-collector layer being in contact with the collector layer at the opposing side of the transition layer.

5. The double hetero-junction bipolar transistor according to claim 4,
wherein the collector layer has a first collector layer in contact with the transition layer and a second collector layer in contact with the sub-collector layer, and
wherein the first collector layer has an impurity concentration greater than the impurity concentration of the second collector layer.

6. The double hetero-junction bipolar transistor according to claim 1, further comprising an intermediate layer between the plurality of the transition layers and the base layer,
wherein the base layer and the doped layer in the transition layers located closest to the base layer sandwiches the intermediate layer.

7. The double hetero-junction bipolar transistor according to claim 6,
wherein the intermediate layer is $In_xGa_{1-x}As$.

8. A bipolar transistor, comprising:
a semi-insulating substrate;
a sub-collector layer provided on the semi-insulating substrate;
a collector layer provided on the sub-collector layer, the collector layer having a first band gap energy;
a plurality of transition layers provided on the collector layer;
a base layer provided on the plurality of transition layers, the base layer having a second band gap energy smaller than the first band gap energy of the collector layer;
an emitter layer provided on the base layer, the emitter layer having a third band gap energy greater than the second band gap energy of the base layer; and
an emitter contact layer provided on the emitter layer,
wherein band gap energies of respective transition layers gradually increase from the base layer to the collector layer and are smaller than the first band gap energy of the collector layer and greater than the second band gap energy of the base layer, and
wherein respective transition layers have a doped layer close to the base layer and an un-doped layer close to the collector layer, the doped layer being doped to have a same conduction type as the collector layer.

9. The bipolar transistor according to claim 8, wherein
the collector layer includes a first collector layer having a first impurity concentration and a second collector layer having an impurity concentration greater than the first impurity concentration, the first collector layer being close to the transition layers and the second collector layer being close to the sub-collector layer.

10. The bipolar transistor according to claim 8, wherein
the semi-insulating substrate, the collector layer and the emitter layer are made of InP, the sub-collector layer, the base layer and the emitter contact layer are made of $In_xGa_{1-x}As$ lattice matched to InP, and the transition layer is made of $In_yGa_zAl_{1-y-z}As$ lattice matched to InP.

11. The bipolar transistor according to claim 8, further comprising an intermediate layer made of un-doped $In_xGa_{1-x}As$ lattice matched to InP, the intermediate layer being provided between the base layer and the transition layers.

* * * * *